(12) United States Patent
Ariji et al.

(10) Patent No.: US 8,686,803 B2
(45) Date of Patent: Apr. 1, 2014

(54) CRYSTAL DEVICE AND MANUFACTURING METHOD THEREOF

(75) Inventors: Takumi Ariji, Saitama (JP); Masakazu Harada, Saitama (JP); Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 64 days.

(21) Appl. No.: 13/431,986

(22) Filed: Mar. 28, 2012

(65) Prior Publication Data
US 2012/0249255 A1      Oct. 4, 2012

(30) Foreign Application Priority Data

Mar. 31, 2011   (JP) ................................. 2011-077244
Feb. 21, 2012   (JP) ................................. 2012-034745

(51) Int. Cl.
*H03B 5/32* (2006.01)

(52) U.S. Cl.
USPC ........................................... 331/158; 331/68

(58) Field of Classification Search
USPC .......................................................... 331/158
See application file for complete search history.

(56) References Cited

U.S. PATENT DOCUMENTS

2004/0095199 A1 *   5/2004   Ono et al. ..................... 331/158

FOREIGN PATENT DOCUMENTS

JP           2007258918           4/2007

* cited by examiner

*Primary Examiner* — Joseph Chang
(74) *Attorney, Agent, or Firm* — Jianq Chyun IP Office

(57) ABSTRACT

A crystal device includes; a base, a framed crystal vibrating blank in which a mesa section is formed on an upper face end bonded to a seal path on an upper surface of the base via a low melting point glass layer or a resin adhesive layer, and a lid bonded to a seal path on an upper surface of the framed crystal vibrating blank via a low melting point glass layer or a resin adhesive layer. A pillow made of low melting point glass or a resin adhesive that suppresses vibration amplitude at the time of a drop impact of the framed crystal vibrating blank is formed on a rear surface of the lid simultaneously with the low melting point glass layer or the resin adhesive layer.

5 Claims, 11 Drawing Sheets

FIG.5
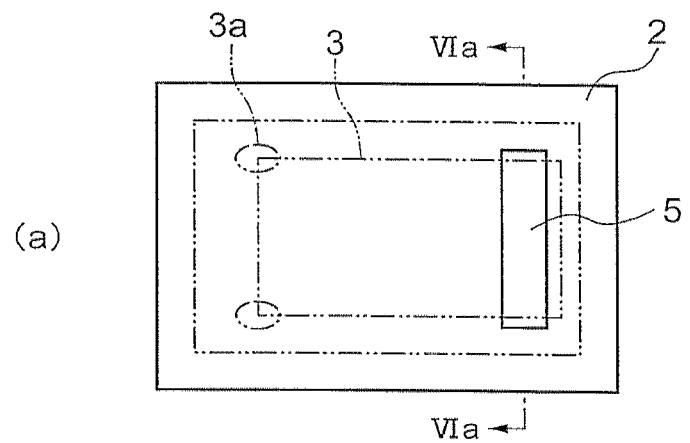
(a)
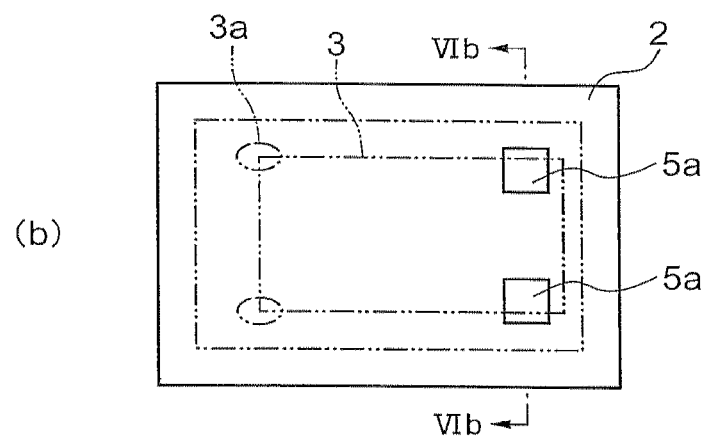
(b)
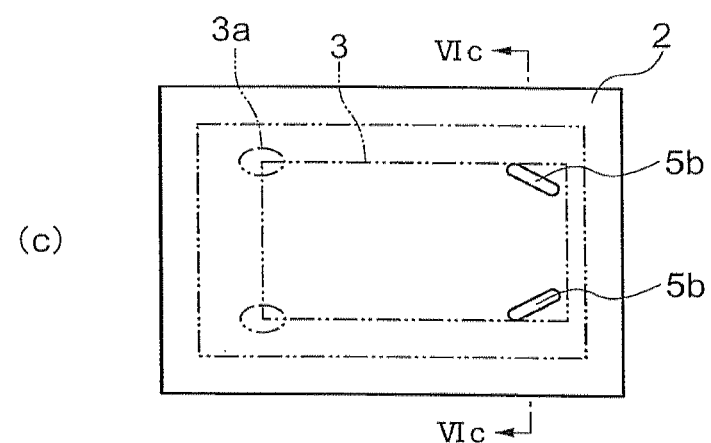
(c)

FIG.11
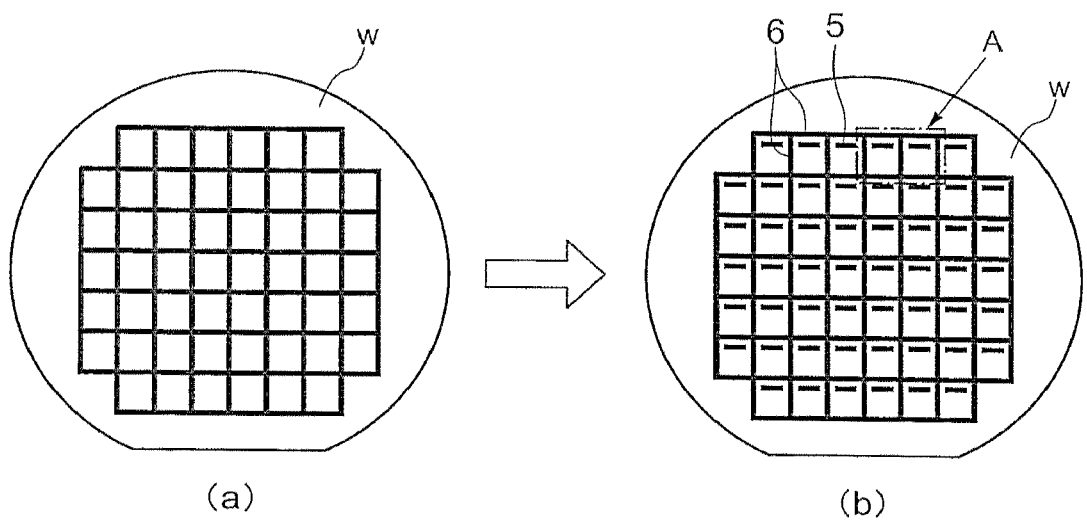
(a)  (b)
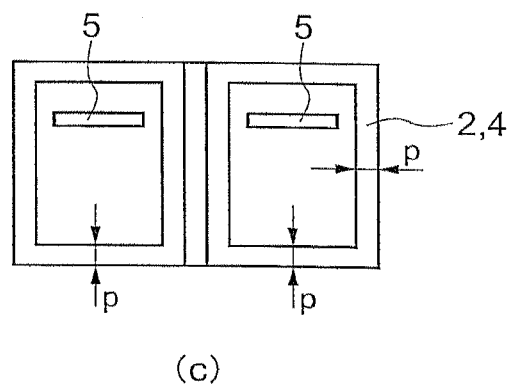
(c)

CRYSTAL DEVICE AND MANUFACTURING METHOD THEREOF

CROSS-REFERENCE TO RELATED APPLICATIONS

This application claims the priority benefit of Japan application serial no. 2011-077244, filed on Mar. 31, 2011, and Japan application no. 2012-034745, filed on Feb. 21, 2012. The entirety of each of the above-mentioned patent applications is hereby incorporated by reference herein and made a part of this specification.

TECHNICAL FIELD

The present invention relates to a crystal device and a manufacturing method thereof. More specifically, the present invention relates to a crystal device in which a reinforcing body (pillow) that suppresses frequency fluctuation due to a drop impact and prevents damage of the crystal device, is formed on a lid or a base of the crystal device by using low melting point glass, and a manufacturing method thereof.

BACKGROUND ART

A crystal device such as a crystal oscillator and a crystal resonator is small and lightweight, and hence, it is used as a reference source of frequency and time in a portable electronic device, for example, a cell phone. As one such a crystal device, there is a crystal resonator in which a crystal vibrating blank is mounted on an upper surface of a base made of ceramic, a metal cover is placed on the base, and a crystal blank is hermetically sealed therebetween by seam welding. Such a crystal resonator includes one in which a pillow in a railroad sleeper shape is formed on the upper surface of the base separately before hermetic sealing to prevent frequency fluctuation and damage due to a drop impact.

Moreover, as shown in Patent Document 1, there is a piezoelectric device in which a base, a framed crystal vibrating blank, and a lid are made of the same material, for example, a crystal plate, and a buffer protrusion is respectively formed on a rear surface of the lid and an upper surface of the base, to prevent a large deflection of a crystal blank at the time of a drop impact, thereby preventing damage due to a collision.

PRIOR ART DOCUMENT

Patent Document 1: Japanese Unexamined Patent Publication No. 2007-258918

SUMMARY OF THE INVENTION

Problems to be Solved by the Invention

However, in the crystal resonator of this conventional type, a reinforcing body in a railroad sleeper shape is formed on an upper surface of a ceramic base, or on a rear surface of a lid and an upper surface of a base made of a crystal plate by a separate step. Consequently, there is a problem in that a separate manufacturing step is required only for forming the reinforcing body.

Means for Solving the Problems

In order to solve the aforementioned problem, in a crystal device of the present invention, low melting point glass is used for bonding a base and a lid or bonding between a base, a crystal resonator, and a lid, and at the time of printing or coating low melting point glass to bonding surfaces thereof, a reinforcing body (pillow) is formed on a rear surface of the lid or an upper surface of the base simultaneously by the low melting point glass.

Therefore, the crystal device of the present invention includes; a base, a framed crystal vibrating blank in which a mesa section is formed on an upper face end or a lower face end bonded to a seal path on an upper surface of the base via a low melting point glass layer, and a lid bonded to a seal path on an upper surface of the framed crystal vibrating blank via a low melting point glass layer. A pillow made of the low melting point glass that suppresses vibration amplitude at the time of a drop impact of the framed crystal vibrating blank is formed on the rear surface of the lid or the upper surface of the base simultaneously with the low melting point glass layer.

Moreover, the crystal device of the present invention includes; a base, a framed crystal vibrating blank in which a mesa section is foamed on an upper face end and a lower face end bonded to a seal path on an upper surface of the base via a low melting point glass layer, and a lid bonded to a seal path on an upper surface of the framed crystal vibrating blank via a low melting point glass layer. A pillow made of the low melting point glass that suppresses vibration amplitude at the time of a drop impact of the framed crystal vibrating blank is formed on the rear surface of the lid and the upper surface of the base simultaneously with the low melting point glass layer.

Furthermore, the crystal device of the present invention includes; a base, a low melting point glass layer simultaneously formed on a pillow made of low melting point glass and a seal path on an upper surface of the base, a crystal vibrating blank mounted on the upper surface of the base, and a lid having a depression in cross-section installed and bonded on the low melting point glass layer.

Furthermore, the crystal device of the present invention is formed by mounting and bonding together; a base having a depression in cross-section, a crystal vibrating blank mounted on the depression of the base, and a lid formed with a pillow made of low melting point glass and a low melting point glass layer on an upper surface of the base.

A manufacturing method of a crystal device of the present invention includes: a step of preparing a wafer for a framed crystal vibrating blank, a base wafer, and a lid wafer; a step of printing or coating paste-like low melting point glass or a resin adhesive layer to a seal path on one principal surface of the base wafer; a step of mounting the wafer for the framed crystal vibrating blank on the low melting point glass or the resin adhesive layer printed on or coated to the base wafer; a step of forming a seal path and a pillow simultaneously by printing or coating paste-like low melting point glass or a resin adhesive layer to a seal path and a pillow forming portion on one principal surface of the lid wafer; a step of mounting the lid wafer on the wafer for the framed crystal vibrating blank mounted on the base wafer, with the seal path and the pillow forming portion facing downward; a step of sticking and bonding the three wafers by heating and pressing the lid wafer; and a step of obtaining a crystal device by dividing the stuck wafers into individual pieces.

Moreover, a manufacturing method of a crystal device of the present invention includes: a step of preparing a wafer for a framed crystal vibrating blank, a base wafer, and a lid wafer; a step of printing or coating paste-like low melting point glass or a resin adhesive layer simultaneously to a seal path and a pillow forming portion on one principal surface of the base wafer to form a seal path and a pillow; a step of mounting the wafer for the framed crystal vibrating blank on the low melting point glass or the resin adhesive layer printed on or coated to the base wafer; a step of printing or coating paste-like low melting point glass or a resin adhesive layer simultaneously to a seal path and a pillow forming portion on one principal surface of the lid wafer or the base wafer to form a seal path and a pillow; a step of mounting the lid wafer on the wafer for the framed crystal vibrating blank mounted on the base wafer, with the seal path and the pillow forming portion facing downward; a step of sticking and bonding the three wafers by heating and pressing the lid wafer; and a step of obtaining a crystal device by dividing the stuck wafers into individual pieces.

Furthermore, a manufacturing method of a crystal device of the present invention includes: a step of preparing a ceramic base wafer and a lid wafer; a step of printing or coating paste-like low melting point glass or a resin adhesive layer simultaneously to a seal path and a pillow forming portion on one principal surface of the ceramic base wafer; a step of mounting a crystal vibrating blank on an upper principal surface of the ceramic base wafer; a step of placing the lid wafer on an upper surface of the ceramic base wafer mounted with the crystal vibrating blank; a step of heating and pressing the lid wafer to bond the lid wafer to the ceramic base wafer and hermetically sealing the crystal vibrating blank therebetween; and a step of obtaining a crystal device by dividing the two bonded wafers into individual pieces.

Furthermore, a manufacturing method of a crystal device of the present invention includes: a step of preparing a ceramic base wafer having a depression in cross-section and a lid wafer having a depression in cross-section; a step of printing or coating paste-like low melting point glass or a resin adhesive layer to a seal path forming portion on one principal surface of the ceramic base wafer; a step of mounting a crystal vibrating blank on the depression on an upper principal surface of the ceramic base wafer; a step of printing or coating paste-like low melting point glass or a resin adhesive layer simultaneously to a seal path and a pillow forming portion on one principal surface of the lid wafer; a step of placing the lid wafer on an upper surface of the ceramic base wafer mounted with the crystal vibrating blank; a step of heating and pressing the lid wafer to bond the lid wafer to the ceramic base wafer and hermetically sealing the crystal vibrating blank therebetween; and a step of obtaining a crystal device by dividing the two bonded wafers into individual pieces.

Effects of the Invention

By forming the reinforcing body (pillow) on the lid or the base of the crystal device at the same time as printing or coating of low melting point glass to the bonding surfaces of the base and the lid, frequency fluctuation due to a drop impact of the crystal device is suppressed and damage of the crystal device is prevented.

BRIEF DESCRIPTION OF THE DRAWINGS

FIG. 5 shows an embodiment of the crystal device of the present invention shown in FIG. 3 and FIG. 4, showing a plan view in which only a base and a pillow formed on an upper surface of the base are shown by solid line. FIG. 5 (*a*) is a plan view of an embodiment in which the pillow is formed in a single bar shape, FIG. 5 (*b*) is a plan view of an embodiment in which the pillow is divided into two pieces, and FIG. 5 (*c*) is a plan view of an embodiment in which two pillows are formed in a V-shape as seen in a plan view.

FIG. 11 is a plan view of an arrangement state of low melting point glass printed or coated to a seal path of a crystal device at the time of manufacturing the crystal device shown in FIG. 1 at a wafer level. FIG. 11(*a*) shows an arrangement state (only the seal path) in a conventional example, FIG. 11(*b*) shows an arrangement state (the seal path and the pillow) of the present invention, and FIG. 11(*c*) shows a seal path p of an individual crystal device.

BEST MODE FOR CARRYING OUT THE INVENTION

Hereunder, a crystal device of first to fourth embodiments of the present invention and a manufacturing method thereof will be explained with reference to the accompanying drawings.

First Embodiment

Figure 1:
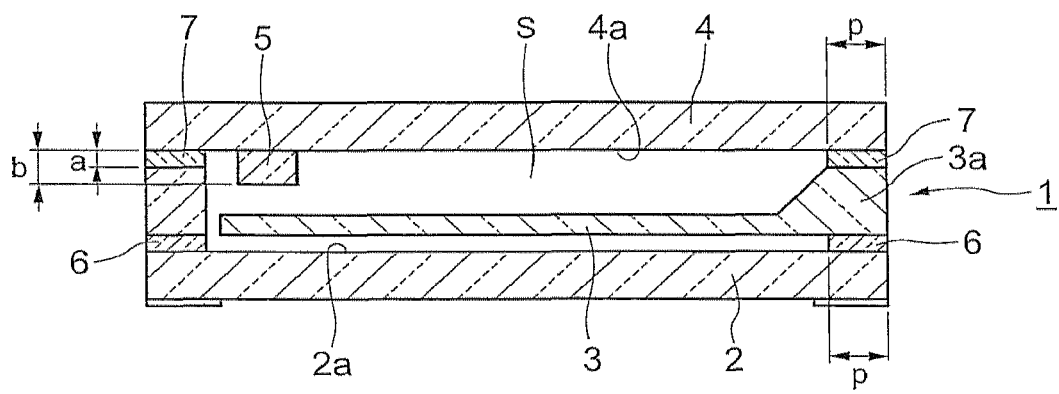
FIG. 1 shows a first embodiment of a crystal device of the present invention, showing a cross-section of the crystal device (three laminations) in which a framed crystal vibrating blank is mounted on a base made of crystal, with a mesa section provided on one surface thereof directed upward, and is bonded to the base by low melting point glass, and a lid made of crystal having a pillow formed on a rear surface thereof is bonded to an upper surface of the framed crystal vibrating blank by the low melting point glass.

As shown in FIG. 1, in a crystal device 1 of a first embodiment of the present invention, a base 2 (first plate-like member), a framed crystal vibrating blank 3 (an outer frame thereof corresponds to an "annular frame"), and a lid 4 (corresponding to a "second plate-like member") are made of the same material as the crystal vibrating blank (including a turning fork type vibrating blank), for example, an AT-cut, Z-cut, or SC-cut crystal plate (wafer). After paste-like low melting point glass 6 (for example, softening temperature: about 330° C., heating temperature at the time of bonding: about 380° C.) is printed or coated to a frame (a seal path; sealed part) p of the base 2, the framed crystal vibrating blank 3 is mounted on the low melting point glass 6 (corresponding to a "bonding material"), and lastly, the lid 4 with low melting point glass 7 coated to and printed on a rear surface thereof is placed thereon, and is heated and pressed vertically to stick the three mother aggregated substrates (wafers) of the base 2, the framed crystal vibrating blank 3, and the lid 4 together. Alternatively, after the base 2 and the framed crystal vibrating blank 3 are bonded together, frequency adjustment is performed, and the lid 4 is bonded thereto, after which the assembly is cut by a dicing saw to manufacture individual pieces of the crystal device 1.

In the first embodiment, because a mesa section (thick wall part) 3a is formed on an upper end surface of the framed crystal vibrating blank 3, a pillow 5 (for example, width: 100µ to 200µ, height: 20 µm) having the same height (20µ) as that of the frame p (seal path) of the lid 4, is printed or coated to a rear surface 4a of the lid 4 by low melting point glass, so that the pillow (reinforcing body) 5 is arranged in a space S between the rear surface 4a of the lid 4 and an upper surface of the framed crystal vibrating blank 3 (when the mesa section is formed on the lower surface, the pillow 5 is formed on the base 2).

The low melting point glass 7 printed or coated to the rear surface 4a of the lid 4 is compressed to have a height of about 5µ (for example, b: 20 µm, a: 5 µm shown in FIG. 1) by being heated and pressed at the time of sticking together the three assembly substrates at the wafer level. However, because the pillow 5 is not pressed, the height of the pillow 5 does not change, and remains as a protrusion. Accordingly, even if the framed crystal vibrating blank 3 vibrates vertically due to an impact at the time of dropping the crystal device 1, the upper end face of the framed crystal vibrating blank 3 touches the pillow 5, and the vibration amplitude of the framed crystal vibrating blank 3 is suppressed to ease the impact.

In the crystal device of the present invention, polyimide resin (a resin adhesive) can be used instead of the low melting point glass, and the arrangement of the base 2 and the lid 4 can be inverted to that shown in FIG. 1.

Second Embodiment

Figure 2:
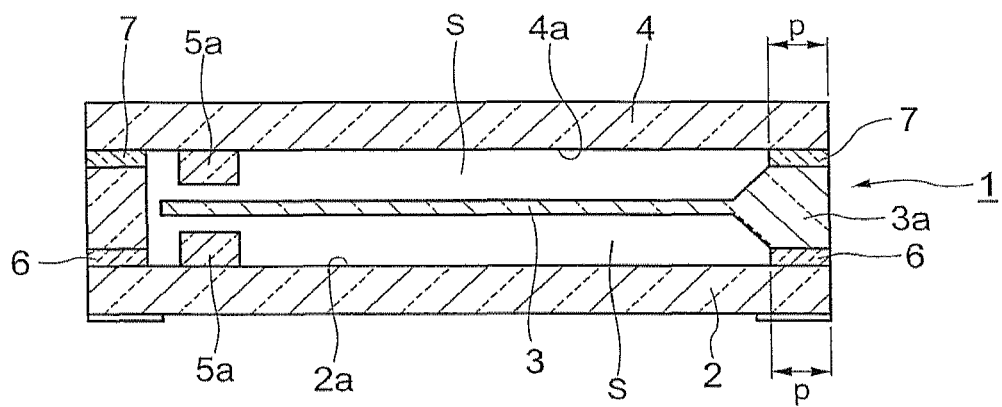
FIG. 2 shows a second embodiment of a crystal device of the present invention, showing a cross-section of the crystal device in which a framed crystal vibrating blank provided with mesa sections on opposite surfaces thereof is mounted on a base made of crystal and having a pillow formed on a upper surface thereof, and is bonded by low melting point glass, and a lid made of crystal and having a pillow formed on a rear surface thereof is bonded to an upper surface of the framed crystal vibrating blank by the low melting point glass.

As shown in FIG. 2, in a crystal device 1 of a second embodiment of the present invention, a mesa section (thick wall part) 3a is formed at ends of opposite surfaces of a framed crystal vibrating blank 3, and a lid 4 and a base 2 are bonded, respectively, to an upper surface and a lower surface of the mesa section 3a by low melting point glass 6 and 7 (bonding material) printed or coated to a rear surface 4a of the lid 4 and an upper surface 2a of the base 2. Here, describing the lid 4 and the base 2 in terms of a broader concept, these can be referred to as a first plate-like member and a second plate-like member. If the lid 4 is the first plate-like member, the base 2 becomes the second plate-like member. On the other hand, if the lid 4 is the second plate-like member, the base 2 becomes the first plate-like member.

In the second embodiment, because the space S is formed between the upper surface and the lower surface of the framed crystal vibrating blank 3, pillows 5a and 5b [5a] are formed on the rear surface 4a of the lid 4 and on the upper surface 2a of the base 2 by three stuck mother aggregated substrates (wafers) made of the same material (for example, crystal plate) as in the first embodiment, and an increase in the vibration amplitude of the crystal vibrating blank at the time of impact is suppressed by the pillows 5a and 5b.

Third Embodiment

Figure 3:
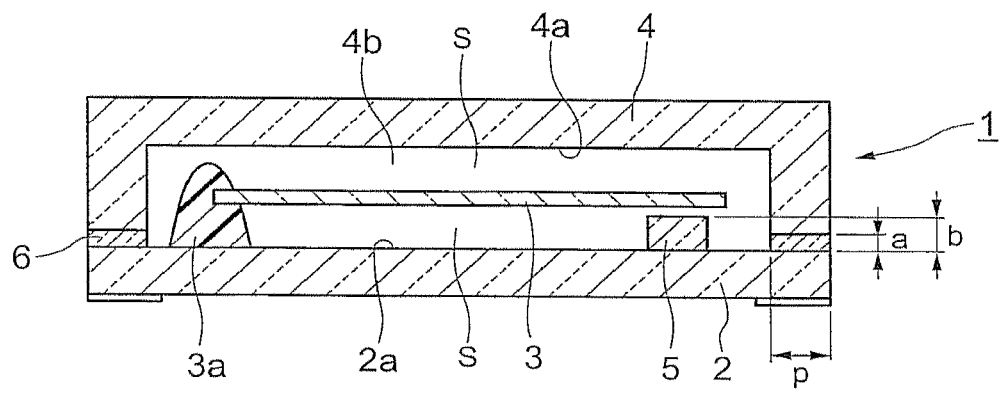
FIG. 3 shows a third embodiment of a crystal device of the present invention, showing a cross-section of the crystal device (two laminations) in which a pillow is formed on an upper surface of a base made of ceramic, glass, or crystal, a crystal vibrating blank is mounted on a lid having a depression in cross-section and made of ceramic, glass, or crystal, the lid is bonded to the base by low melting point glass, and the crystal vibrating blank is hermetically sealed in the depression of the lid.

As shown in FIG. 3, in a crystal device of a third embodiment of the present invention, a pillow 5 is formed simultaneously with a seal path p on a flat ceramic base 2 (corresponding to the "second plate-like member") at a wafer level by printing or coating low melting point glass 6 (corresponding to the "bonding material"), and a crystal vibrating blank 3 is fixed by an electrically-conductive adhesive 3a and mounted on an upper surface 2a of the base 2. Thereafter, a lid 4 (an outer frame thereof corresponds to an "annular frame") having a depression in cross-section is placed thereon and heated and pressed vertically, thereby hermetically sealing the crystal vibrating blank 3 in a space S in the depression 4b. As in the aforementioned embodiments, the thickness of the low melting point glass formed on the seal path becomes thinner than the height of the pillow, thereby strengthening the hermetic sealing.

Here, crystal is used for the lid 4. However, crystal and glass material can be used for the lid and the base.

Fourth Embodiment

Figure 4:
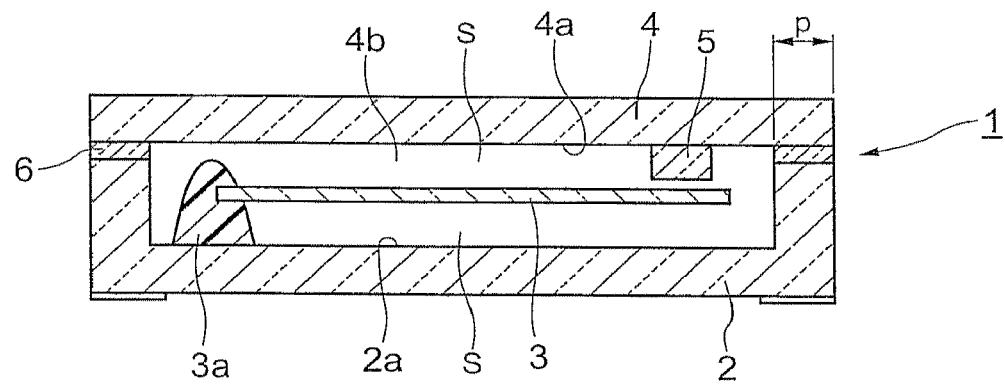
FIG. 4 shows a fourth embodiment of a crystal device of the present invention, showing a cross-section of the hermetically sealed crystal device (two laminations) in which a pillow is formed on a rear surface of a lid made of crystal or glass, and the lid is bonded to an upper surface of a base having a depression in cross-section made of ceramic, glass, or crystal by low melting point glass, and a crystal vibrating blank is mounted in the depression of the base.

As shown in FIG. 4, in a crystal device 1 of a fourth embodiment of the present invention, a crystal vibrating blank 3 is fixed by an electrically-conductive adhesive 3a and mounted on an inner bottom surface 2a at a base of a depression 4b of a ceramic base 2 having a depression in cross-section (a tabular part excluding an outer frame corresponds to the "first plate-like member"), and a lid 4 (corresponding to the "second plate-like member"), on which a pillow 5 is formed simultaneously with a seal path p by printing or coating low melting point glass 6 on one surface, is placed on an upper surface of the base 2 via the low melting point glass 6, which are then pressed vertically and bonded together, thereby hermetically sealing the crystal vibrating blank 3 in a space S in the depression.

Here, as in the aforementioned embodiments, crystal or glass material can be used for the lid and the base.

Figure 6:
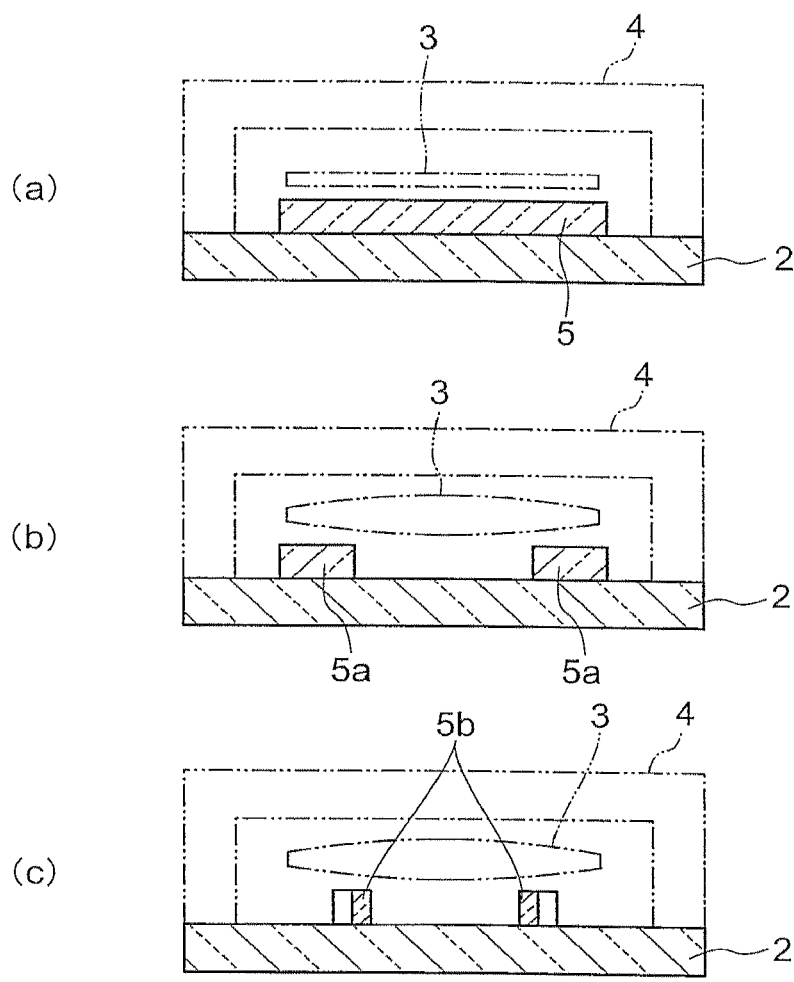
FIG. 6 is a sectional view on arrow VI-VI of the crystal device shown in FIG. 5, wherein FIG. 6 (*a*) is a sectional view on arrow VI-VIa, FIG. 6 (*b*) is a sectional view on arrow VI-VIb, and FIG. 6 (*c*) is a sectional view on arrow VI-VIc.

Here, in the third and fourth embodiments of the crystal device of the present invention shown in FIG. 3 and the FIG. 4, two pillows 5 as shown in FIG. 5 (b) and FIG. 6 (b) or two pillows 5 separated in a V-shape (fan shape) as seen in the plan view as shown in FIG. 5(c) and FIG. 6(c) can be used instead of the single bar-shape pillow 5 shown in FIG. 5(a) and FIG. 6(a).

In this manner, by using the pillow separated into two, an amount of the paste-like low melting point glass or adhesive required for forming the pillow can be cut down as compared with the case of one pillow. Moreover, as shown in FIG. 6(b) and FIG. 6(c), when the pillow is separated into two, there is an advantage in that the entire crystal device can be made low when a crystal blank in a bevel or convex shape in cross-section is used. That is to say, in a case of one pillow shown in FIG. 6(a), it is essential that the entire crystal blank is away from an upper surface of the pillow so that a thick portion (expanded portion) of the crystal blank does not come in contact with the pillow. On the other hand, as shown in FIGS. 6(b) and 6(c), when the pillow is separated into two and arranged, because the crystal blank can be arranged dropped downward within a range in which the expanded portion of the crystal blank does not come in contact with the pillow, the crystal device can have a low height.

Manufacturing Method of a Crystal Device of the Present Invention

Manufacturing Method of the Crystal Device of the First Embodiment

Figure 7:
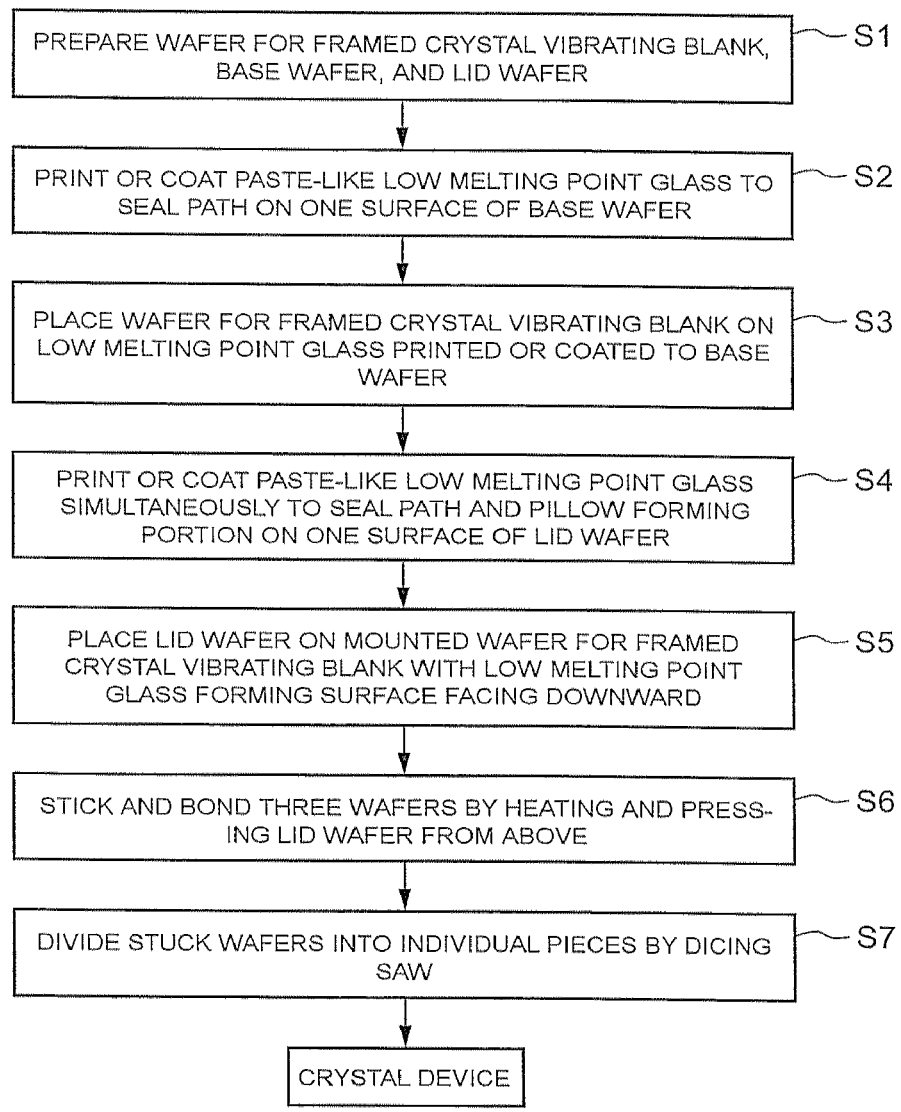
FIG. 7 is a flowchart showing a manufacturing process of the first embodiment of the crystal device of the present invention shown in FIG. 1.

As shown in FIG. 7 and FIG. 11, mother aggregated substrates (wafers) W having a diameter of for example, 3 to 4 inches for; a framed crystal vibrating blank (a crystal vibrating blank has been already formed), for a base, and for a lid, that can manufacture a plurality of crystal devices having a size of 2.0 mm×1.6 mm, are prepared (S1).

Next, as shown in FIG. 11(c), paste-like low melting point glass (softening temperature: about 330° C.) or a resin adhesive is printed or coated to respective seal paths p so that crystal blanks corresponding to bases of 1000 crystal devices can be formed on one surface of a base wafer W (S2).

Then, the wafer for the framed crystal vibrating blank is placed on the paste-like low melting point glass printed or coated to a portion corresponding to the seal path p on an upper surface of the base wafer W, with a mesa section 3a facing upward (S3).

Moreover, low melting point glass 7, which becomes the seal path p and a pillow 5, is printed or coated to one principal surface of a lid wafer or the base wafer (S4).

A lid wafer 4 is placed on the wafer for the framed crystal vibrating blank placed on the base wafer, with the seal path p and the pillow 5 formed by the low melting point glass facing downward (S5).

The three wafers for the lid, for the framed crystal vibrating blank, and for the base are stuck together and bonded by heating and pressing the lid wafer in a vertical direction (S6). The low melting point glass 6 and 7 printed or coated to the bonding surface is compressed and crushed due to the bonding, and the thickness thereof becomes thin. However, because the pillow formed on the lid wafer or on the base wafer is not pressed, the pillow remains as a protrusion.

Lastly, the bonded three wafers W are divided into individual pieces by a dicing saw (S7), to obtain, for example, 1000 individual pieces of crystal devices.

Manufacturing Method of the Crystal Device of the Second Embodiment

Figure 8:
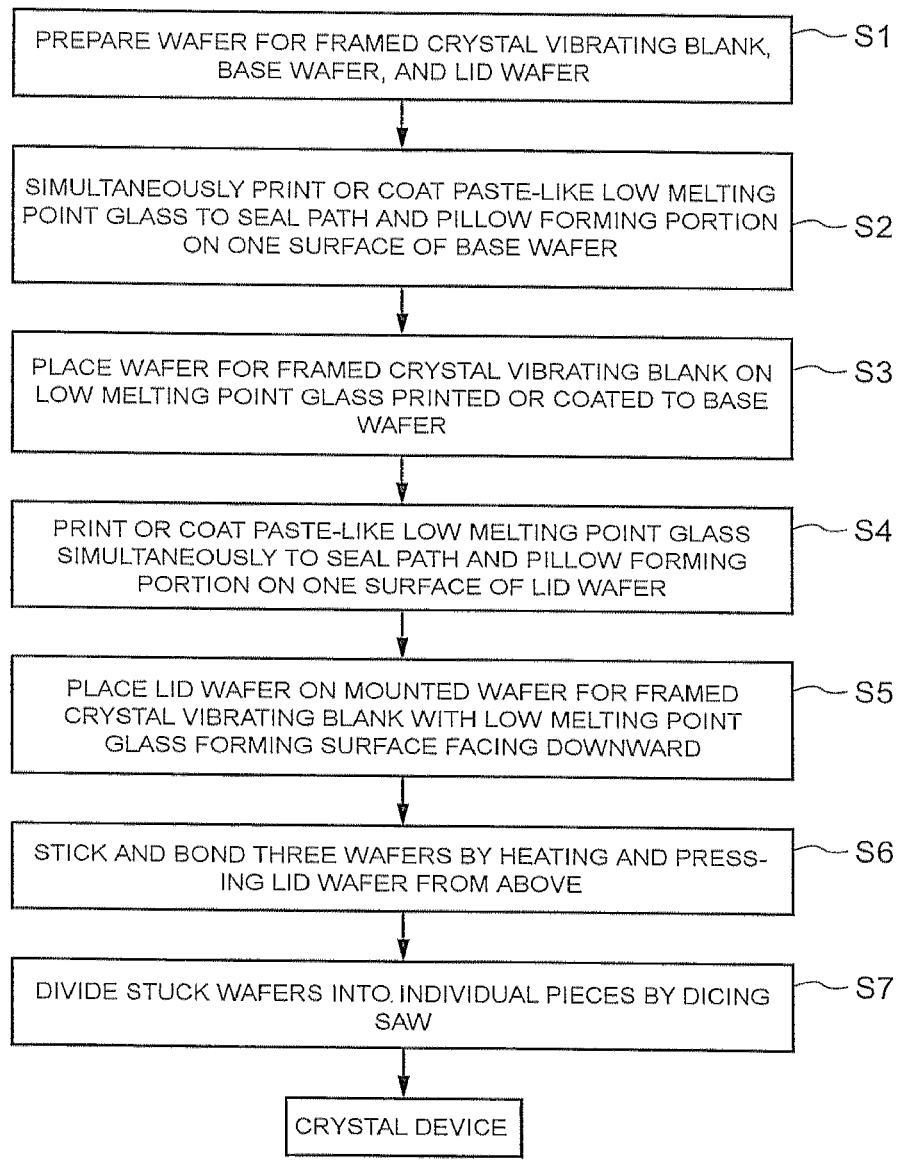
FIG. 8 is a flowchart showing a manufacturing process of the second embodiment of the crystal device of the present invention shown in FIG. 2.

As shown in FIG. 8, as in the first embodiment, a wafer for the framed crystal vibrating blank wafer, a base wafer, and a lid wafer are prepared (S1).

Next, paste-like low melting point glass is simultaneously printed or coated to a seal path and a pillow forming portion on one surface of the base wafer (S2).

Moreover, the wafer for the framed crystal vibrating blank is placed on the low melting point glass printed or coated to the base wafer (S3).

The paste-like low melting point glass is simultaneously printed or coated to a seal path and a pillow forming portion on one surface of the lid wafer (S4).

Furthermore, the lid wafer is placed on the wafer for the framed crystal vibrating blank placed on the base wafer, with the surface on which the low melting point glass is formed (printed or coated) facing downward (S5).

Furthermore, the three wafers are stuck together and bonded by heating and pressing the lid wafer from above (S6).

Lastly, the bonded three wafers are divided into individual pieces by a dicing saw, to obtain individual pieces of crystal devices. (S7).

Manufacturing Method of the Crystal Device of the Third Embodiment

Figure 9:
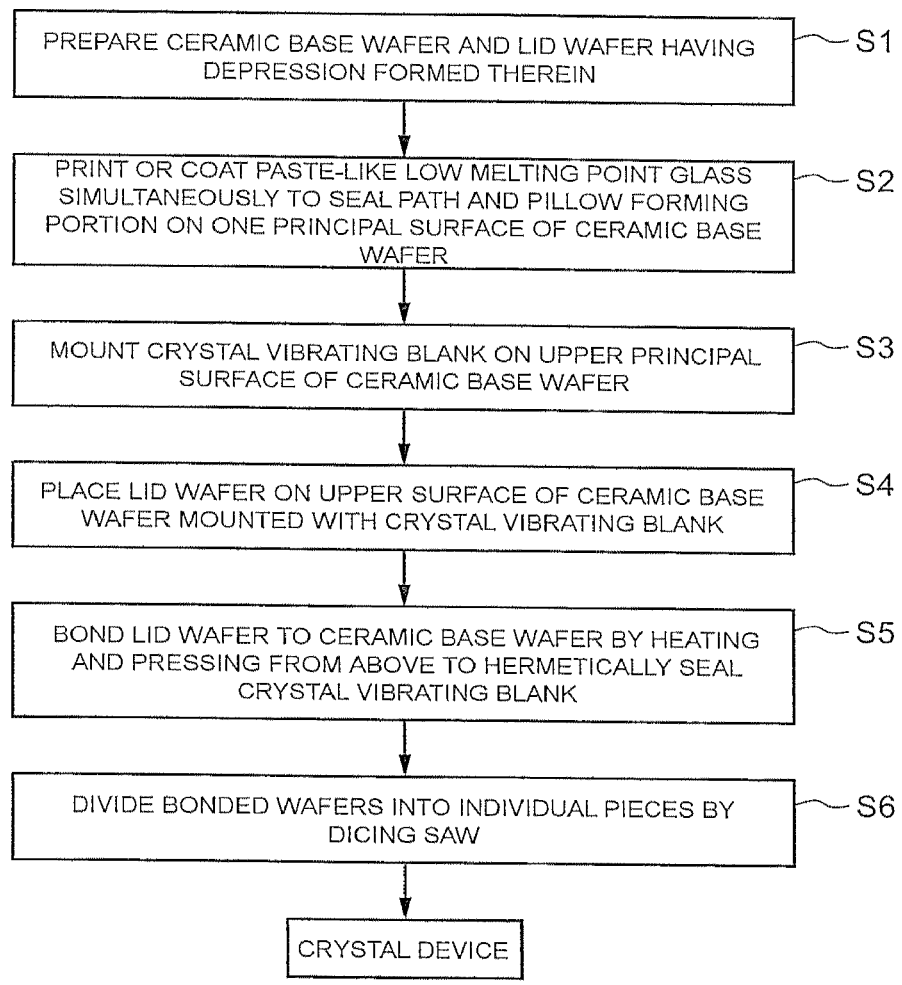
FIG. 9 is a flowchart showing a manufacturing process of the third embodiment of the crystal device of the present invention shown in FIG. 3.

As shown in FIG. 9, a ceramic base wafer and a lid wafer having a depression in cross-section are prepared (S1).

Next, paste-like low melting point glass is simultaneously printed or coated to a seal path and a pillow forming portion on one surface of the ceramic base wafer (S2).

Moreover, a crystal vibrating blank is mounted on an upper principal surface of the ceramic base wafer (S3).

The lid wafer is placed on the upper surface of the ceramic base wafer mounted with the crystal vibrating blank, with the depression facing downward (S4).

Furthermore, the lid wafer is bonded to the ceramic base wafer via the low melting point glass by heating and pressing the lid wafer from above, to hermetically seal the crystal vibrating blank (S5).

Lastly, the bonded two wafers are divided by a dicing saw, to obtain individual pieces of crystal devices (S6).

Manufacturing Method of the Crystal Device of the Fourth Embodiment

Figure 10:
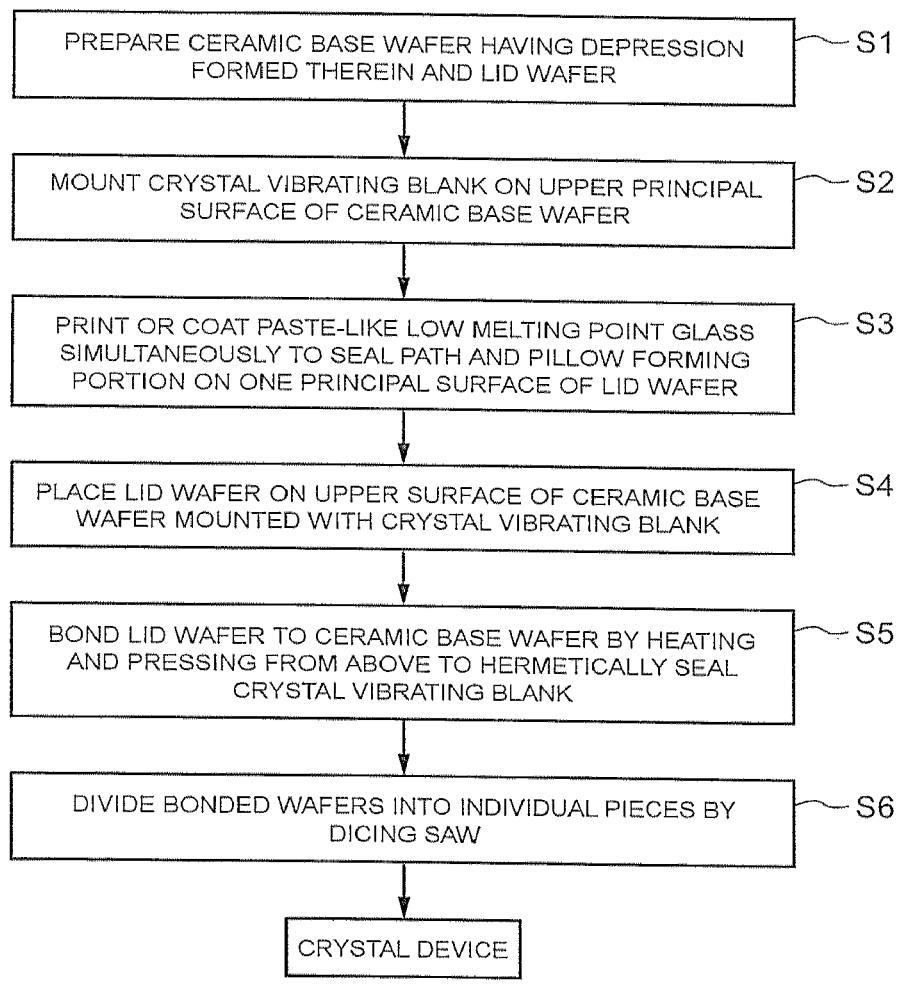
FIG. 10 is a flowchart showing a manufacturing process of the fourth embodiment of the crystal device of the present invention shown in FIG. 4.
Figure 12:
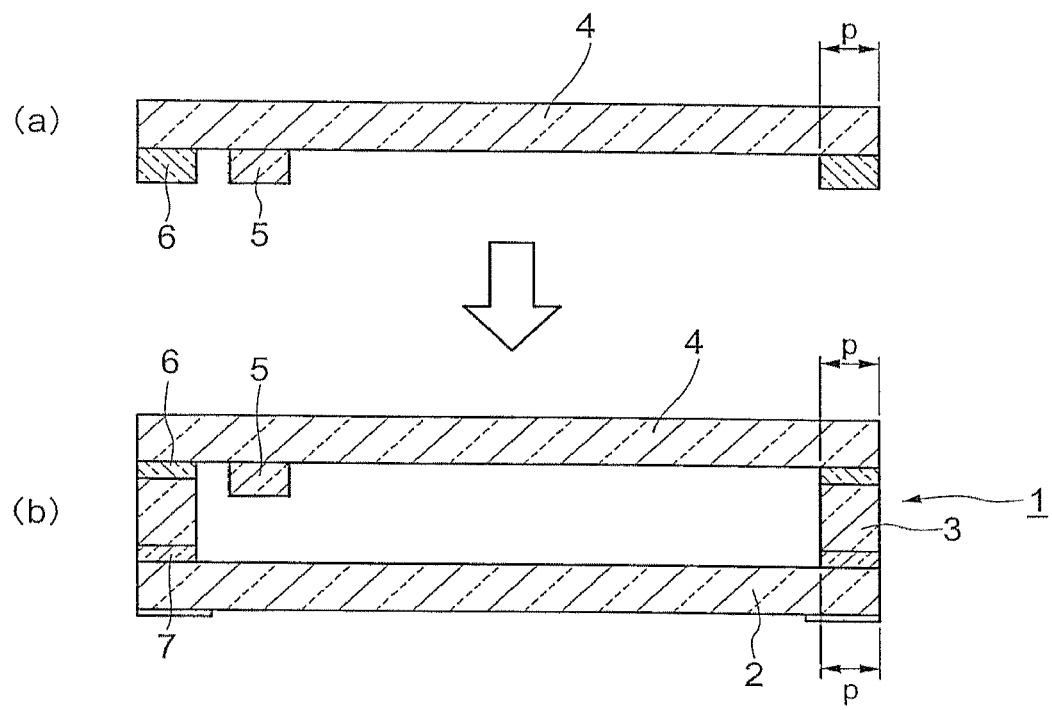
FIG. 12 shows a bonding state of the base, the framed crystal vibrating blank, and the lid in a manufacturing process of the crystal device shown in FIG. 1, wherein FIG. 12(*a*) is a conceptual diagram before bonding, and FIG. 12(*b*) is a conceptual diagram after bonding.
Figure 13:
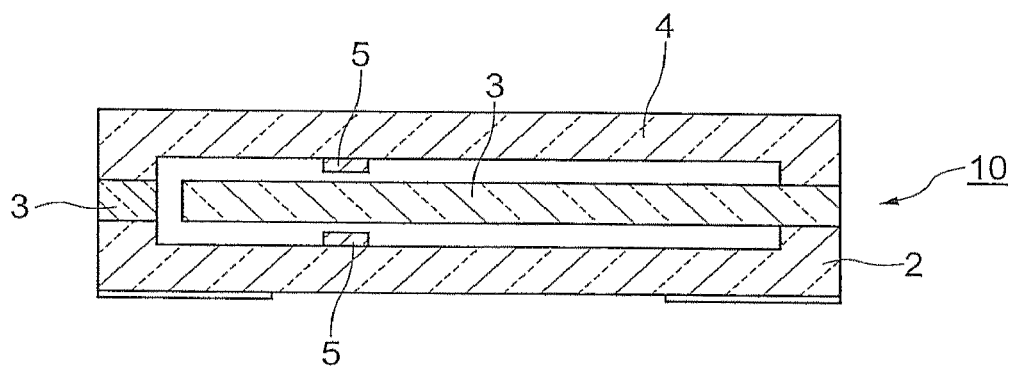
FIG. 13 is a sectional view of a piezoelectric device in a conventional example in which, in a piezoelectric device constituted by surface activated bonding of a base, a framed crystal vibrating blank, and a lid made of the same material, a pillow is formed on an upper surface of the base or on a rear surface of the lid in a separate process from the bonding process.

As shown in FIG. 10, a ceramic base wafer having a depression in cross-section and a lid wafer are prepared (S1).

Next, a crystal vibrating blank is mounted on an upper principal surface of the ceramic base wafer (S2).

Moreover, paste-like low melting point glass is simultaneously printed or coated to a seal path and a pillow forming portion of the lid wafer (S3).

The lid wafer is placed on the upper surface of the ceramic base wafer mounted with the crystal vibrating blank, with the pillow facing downward (S4).

Furthermore, the lid wafer is bonded to the ceramic base wafer by heating and pressing the lid wafer from above, to hermetically seal the crystal vibrating blank (S5).

Lastly, the bonded two wafers are divided by a dicing saw, to obtain individual pieces of crystal devices (S6).

What is claimed is:

1. A crystal device comprising:
   a first plate-like member;
   an annular frame provided on said first plate-like member in a standing condition;
   a second plate-like member bonded to said frame by a bonding material to form an enclosed space by said first plate-like member and said frame; and
   a crystal vibrating blank housed in said enclosed space, wherein
   a pillow made of the same material as said bonding material that suppresses vibration amplitude at the time of a drop impact of said crystal vibrating blank is foamed on said second plate-like member.

2. A crystal device according to claim 1, wherein said crystal vibrating blank is integrally formed with said frame.

3. A crystal device according to claim 1, wherein said crystal vibrating blank is bonded to said first plate-like member or said second plate-like member by using a conductive adhesive.

4. A manufacturing method of a crystal device comprising: the steps of;
- preparing a wafer for a framed crystal vibrating blank including a plurality of framed crystal vibrating blanks, each having a crystal vibrating blank and a frame surrounding a periphery of said crystal vibrating blank;
- preparing a wafer for a first plate-like member including a plurality of first plate-like members to be bonded to one principal surface of said frame;
- preparing a wafer for a second plate-like member including a plurality of second plate-like members to be bonded to the other principal surface of said frame;
- forming a bonding material in an area of said wafer for the first plate-like member, that is to be bonded to said frame;
- forming a bonding material in an area of said wafer for the second plate-like member, that is to be bonded to said frame, and in at least a part of an area of said wafer for the second plate-like member facing said crystal vibrating blank that is an area to form a pillow;
- bonding said wafer for the first plate-like member to one principal surface of said wafer for the framed crystal vibrating blank;
- bonding said wafer for the second plate-like member to the other principal surface of said wafer for the framed crystal vibrating blank; and
- obtaining a crystal device by dividing said wafer for the framed crystal vibrating blank, said wafer for the first plate-like member, and said wafer for the second plate-like member bonded together, into individual pieces.

5. A manufacturing method of a crystal device comprising: the steps of;
- preparing a wafer for a plate-like member including a plurality of plate-like members;
- preparing a wafer for a depressed member including a plurality of depressed members having a depression formed therein, which is to be bonded to said plate-like member;
- preparing a crystal vibrating blank to be housed in an enclosed space formed by bonding said plate-like member and said depressed member;
- forming a bonding material serving as a pillow in an area of said wafer for the plate-like member to be bonded to a frame member and in at least a part of an area of said wafer for the plate-like member facing said crystal vibrating blank;
- mounting said crystal vibrating blank on said wafer for the plate-like member or said wafer for the depressed member;
- bonding said wafer for the plate-like member and said wafer for the depressed member together; and
- obtaining a crystal device by dividing said wafer for the plate-like member and said wafer for the depressed member bonded together, into individual pieces.

* * * * *